(12) United States Patent
Tomaki et al.

(10) Patent No.: US 7,538,282 B2
(45) Date of Patent: May 26, 2009

(54) MULTISTAGE SWITCH

(75) Inventors: Kenji Tomaki, Kanazawa (JP); Masanaga Nishikawa, Kanazawa (JP); Masaya Ueda, Hakusan (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/780,089

(22) Filed: Jul. 19, 2007

(65) Prior Publication Data
US 2007/0257753 A1 Nov. 8, 2007

Related U.S. Application Data

(63) Continuation of application No. PCT/JP2006/300483, filed on Jan. 17, 2006.

(30) Foreign Application Priority Data
Jan. 19, 2005 (JP) ............................. 2005-011996

(51) Int. Cl.
*H01H 9/00* (2006.01)
(52) U.S. Cl. ..................... 200/4; 335/202; 345/161; 455/550
(58) Field of Classification Search ............. 200/4; 335/202–207, 215; 345/161, 156.157; 455/90, 455/414, 550
See application file for complete search history.

(56) References Cited

U.S. PATENT DOCUMENTS

| | | | |
|---|---|---|---|
| 4,251,795 A | 2/1981 | Shibasaki et al. | |
| 6,831,629 B2 | 12/2004 | Nakamura et al. | |
| 6,900,713 B2 | 5/2005 | Kasashima et al. | |
| 2002/0061735 A1 | 5/2002 | Wingett et al. | |
| 2005/0068134 A1 | 3/2005 | Nishino et al. | |
| 2005/0068135 A1 | 3/2005 | Nishino et al. | |
| 2005/0088411 A1 | 4/2005 | Nishino et al. | |
| 2005/0093822 A1 | 5/2005 | Nishino et al. | |
| 2005/0099391 A1 | 5/2005 | Nishino et al. | |

FOREIGN PATENT DOCUMENTS

| | | |
|---|---|---|
| JP | 49-34675 | 3/1974 |
| JP | 54-75284 A | 6/1979 |
| JP | 60-237722 A | 11/1985 |
| JP | 05-249210 A | 9/1993 |
| JP | 2000-011827 A | 1/2000 |
| JP | 2000-057888 A | 2/2000 |
| JP | 2000-259321 A | 9/2000 |
| JP | 2002-150904 A | 5/2002 |
| JP | 2003-060256 A | 2/2003 |
| JP | 2004-171585 A | 6/2004 |

OTHER PUBLICATIONS

Official Communication for PCT Application No. PCT/JP2006/300483; mailed on Feb. 21, 2006.

*Primary Examiner*—Kyung Lee
(74) *Attorney, Agent, or Firm*—Keating & Bennett, LLP

(57) ABSTRACT

A multistage switch includes a switch push button. A magnet is disposed in a recess of the inner wall surface of the switch push button. The multistage switch further includes a magnetic sensor, and the magnetic sensor includes a substrate. Two magnetoelectric transducers are mounted on a surface of the substrate, and are disposed so as to face the magnet.

6 Claims, 3 Drawing Sheets

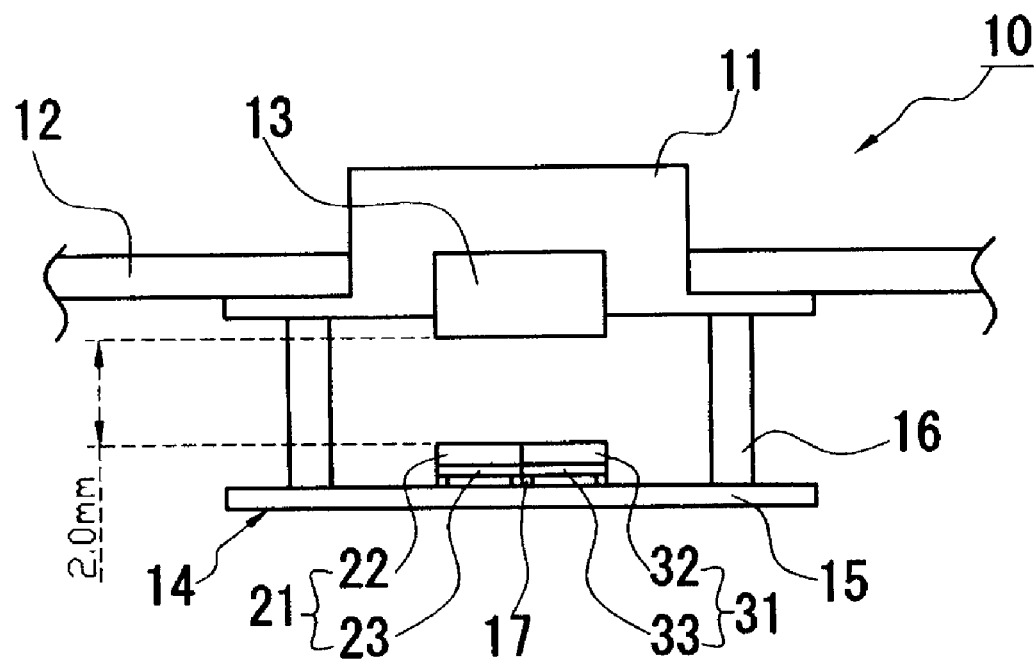
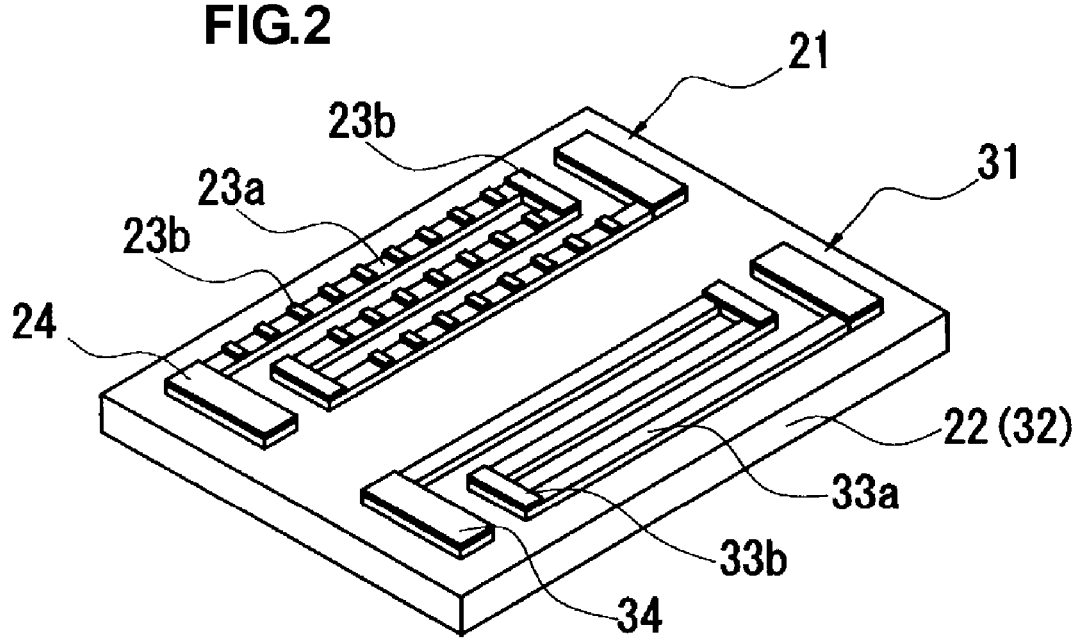

MULTISTAGE SWITCH

BACKGROUND OF THE INVENTION

1. Field of the Invention

The present invention relates to multistage switches. More specifically, the present invention relates to a multistage switch used for a shutter switch of a camera, a photographing switch of a video camera, a switch of other electronic apparatuses, etc., for providing a single switch with a plurality of operation instruction functions.

2. Description of Related Art

In the related art, multistage switches using disc springs have been generally known (see Japanese Unexamined Patent Application Publication No. 2000-57888). The multistage switches using disc springs function as multistage switches in which a switch push button is pressed by a user so that a plurality of disc springs provided in a multistage switch are sequentially deformed according to the pressing force with which the disc springs are pressed and the operating state of an electronic apparatus is sequentially switched.

The multistage switches of the related art using disc springs, etc., allow the operating state to be switched according to an amount by which a switch push button is pressed during the operation of the multistage switch. If a user desires to switch to the operating state of the first stage, the user may apply large force to the switch push button against the elastic force of the disc springs to switch to the operating state of the second or further stage. Thus, the user who wishes to obtain a desired operating state may not successfully obtain the desired operating state due to the mismatch between the user's feeling of operation and the actual operation of the multistage switch.

Specifically, a multistage switch used for a shutter of a camera typically has two operating stages, the first stage corresponding to the focusing operation and the second stage corresponding to the shutter release operation, i.e., the photographing operation. If the user fails to accurately press the switch push button, the shutter may often be released in an out-of-focus state.

Recently, in particular, with the reduction in size of cameras, there has also been a demand for a reduction in size of multistage switches, and a switch push button of a multistage switch is moved by a distance of approximately 2 mm from the state where no force is applied to the switch to the state where the shutter is released, i.e., the state of the second stage. The first stage corresponding to the focusing operation must be established within the distance of 2 mm. It is difficult for a general user to press the switch push button such a small distance and keep the focusing operation of the first stage against the pressure of the disc springs, and camera shake may be caused. Consequently, a problem of inaccurate focusing may arise.

SUMMARY OF THE INVENTION

In order to overcome the foregoing problems, preferred embodiments of the present invention provide a multistage switch including a magnetic sensor including a substrate and a magnetoelectric transducer defined on the substrate; a switch push button; and a magnetic member provided in the switch push button and disposed so as to face the magnetoelectric transducer, wherein the magnetic sensor is arranged to detect, as a detected potential, a potential produced at the magnetoelectric transducer in the magnetic sensor by a change in a distance between the magnetic sensor and the magnetic member, at least two threshold values are provided for the detected potential, and an operating state is changed according to results of comparison between the threshold values and the detected potential.

The magnetoelectric transducer is preferably a semiconductor magnetoresistive element.

The magnetic sensor preferably includes two magnetoelectric transducers connected in series. The detected potential is a detected potential at a node between the two magnetoelectric transducers. A first magnetoelectric transducer of the two magnetoelectric transducers has a predetermined change in a potential produced by a change in a distance between the first magnetoelectric transducer and the magnetic member, and a second magnetoelectric transducer of the two magnetoelectric transducers has substantially no change in a potential produced by a change in a distance between the second magnetoelectric transducer and the magnetic member. The first magnetoelectric transducer and the second magnetoelectric transducer preferably have substantially identical temperature characteristics.

The two magnetoelectric transducers preferably are semiconductor magnetoresistive elements. The first magnetoelectric transducer preferably includes a semiconductor magnetoresistive thin film defined on a substrate, a plurality of short-circuiting electrodes defined on the semiconductor magnetoresistive thin film, and an external electrode connected to the outside. The second magnetoelectric transducer preferably includes a semiconductor magnetoresistive thin film defined on the substrate, and an external electrode connected to the outside, and includes the semiconductor magnetoresistive thin film having no short-circuiting electrodes or a smaller number of short-circuiting electrodes than the number of short-circuiting electrodes included in the first magnetoelectric transducer.

A moving mechanism of the switch push button is independent from an operation signal system in the magnetic sensor.

The magnetic sensor includes a package covering the magnetoelectric transducer, and the package is disposed on the magnetic sensor so that a space between the package and a magnetosensitive section of the magnetoelectric transducer is not more than about 0.3 mm.

In the multistage switch having the above-described structure, the magnetic member and the magnetoelectric transducer are used to detect, as a potential, a change in magnetic force due to a change in the distance therebetween, and a user can smoothly press a switch push button without being subjected to strong physical reaction force such as a force of disc springs. Therefore, for example, when the multistage switch is used in a camera or the like, the user does not feel strong reaction force, and can perform the focusing operation corresponding to the operating state of the first stage with a very low possibility of causing camera-shake, etc. The multistage switch used in any other compact electronic apparatus can also provide stable operation characteristics.

Since a semiconductor magnetoresistive element is preferably used as a magnetoelectric transducer, even if the moving distance of the switch push button is small, that is, if the change in the distance between the magnetic member and the semiconductor magnetoresistive element is small, an output characteristic having a large output value with respect to a small change in magnetic force caused by the change in the distance can be obtained. Further, the output characteristic exhibits a sharp linearity, and it is easy to set threshed values for multiple stages.

Furthermore, the magnetic sensor includes two magnetoelectric transducers connected in series, of which a second magnetoelectric transducer has substantially no magnetic sensitivity. Therefore, a change in a detected potential, which is a potential at a node between the two magnetoelectric transducers, depends on electrical characteristics of a first magnetoelectric transducer. Since the temperature characteristics of the two magnetoelectric transducers connected in series are substantially identical, no potential difference between the two magnetoelectric transducers occurs due to the temperature change. Thus, the detected potential at the node between the two magnetoelectric transducers is not affected by the temperature change. The detected potential of the magnetic sensor in the present preferred embodiment is therefore a potential indicating a change that purely depends on the magnetic change, in which the influence of a change in ambient temperature is canceled, in the change in the potential of the first magnetoelectric transducer.

When semiconductor magnetoresistive elements are used as the two magnetoelectric transducers, the semiconductor magnetoresistive element defining as the first magnetoelectric transducer preferably includes a predetermined number of short-circuiting electrodes to achieve a predetermined magnetoresistive effect, and the second semiconductor magnetoresistive element preferably includes no short-circuiting electrodes or a smaller number of short-circuiting electrodes to substantially eliminate the magnetoresistive effect. With such a simple structure, the magnetoresistive effect of the second magnetoelectric transducer can be substantially eliminated, and the temperature characteristics of the two magnetoelectric transducers can be identical.

Furthermore, an operating mechanism of the switch push button and an operation signal system of the magnetic sensor are independent, that is, the operation signal system is separated, thus providing the switch push button with an operation that is not related to an operation signal of the magnetic sensor. In particular, the switch push button can be moved between threshold values irrespective of an operation signal system, thus preventing the user from excessively pressing the switch push button when moving the switch push button between the threshold values. Such malfunction can be prevented.

Furthermore, a package is disposed on the magnetic sensor so that a space between the package and the magnetoelectric transducers is not more than about 0.3 mm, thus achieving a reduction in thickness of the magnetic sensor. This ensures a wide operation area including the switch push button.

Other features, elements, steps, characteristics and advantages of the present invention will be described below with reference to preferred embodiments thereof and the attached drawings.

BRIEF DESCRIPTION OF THE DRAWINGS

FIG. 1 is a schematic diagram showing a structure of a multistage switch according to a preferred embodiment of the present invention.

FIG. 2 is a perspective view showing a structure of semiconductor magnetoresistive elements preferably included in the multistage switch according to a preferred embodiment of the present invention.

DETAILED DESCRIPTION OF PREFERRED EMBODIMENTS

Figure 3:
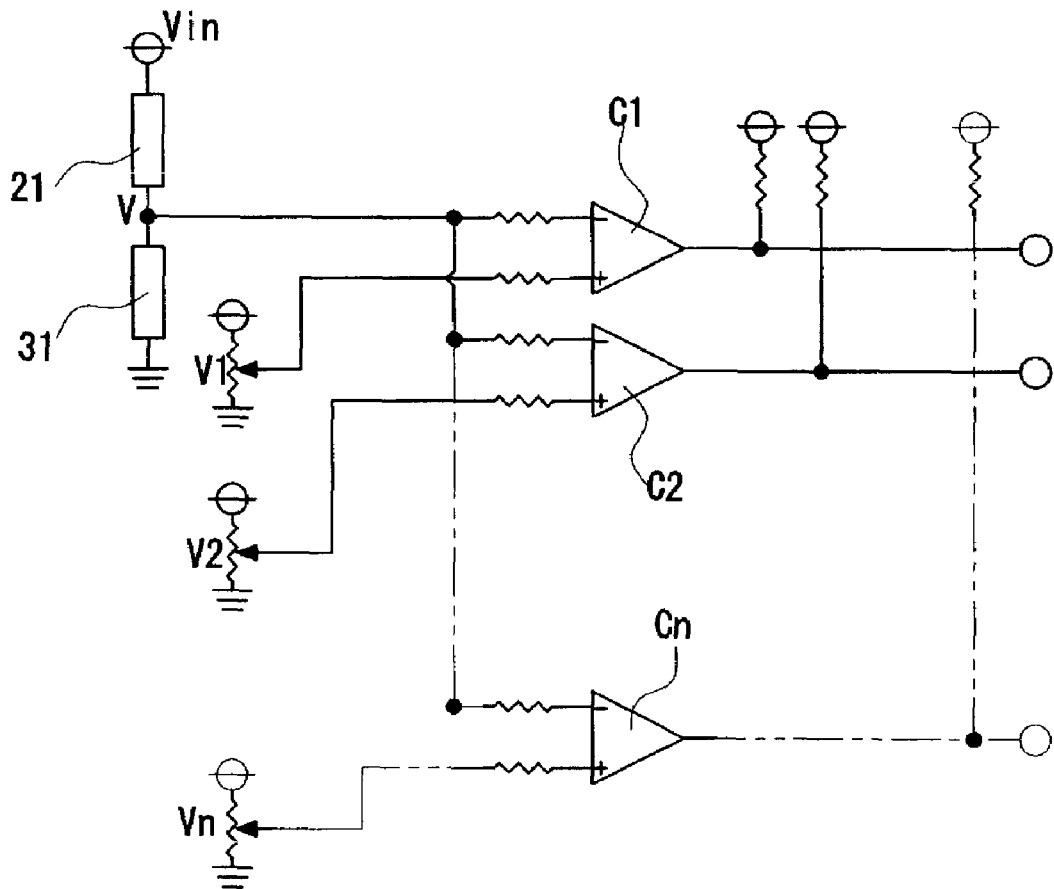
FIG. 3 is a circuit diagram of the multistage switch according to a preferred embodiment of the present invention.

The features of the present invention will be described in more detail hereinafter with respect to preferred embodiments of the present invention.

A multistage switch according to a preferred embodiment of the present invention will be described with reference to FIGS. 1 and 2. The present preferred embodiment will be described in the context of a multistage switch used for a shutter of a camera by way of example.

A multistage switch 10 shown in FIG. 1 includes a switch push button 11 serving as a shutter release button. The switch push button 11 is surrounded by a housing 12 of the camera, and is generally projected slightly from the housing. A magnet 13 serving as a magnetic member is disposed in a recess of the inner wall surface of the switch push button 11. The magnet 13 is disposed so that lines of magnetic force are generated in the direction in which the switch push button 11 is pressed, i.e., in the direction indicated by an arrow shown in FIG. 1. In the present preferred embodiment, the south pole of the magnet 13 is oriented toward the top of the switch push button 11, and the north pole of the magnet 13 is oriented on the bottom side of the switch push button.

The multistage switch 10 further includes a magnetic sensor 14. The magnetic sensor 14 includes a substrate 15 defining a main circuit of the sensor. The substrate 15 is preferably made of, for example, a glass epoxy material or ceramic material. Two magnetoelectric transducers 21 and 31 are mounted on a surface of the substrate 15. These two magnetoelectric transducers 21 and 31 are disposed so as to face the north pole of the magnet 13.

In the multistage switch 10, only a weak reaction force is required to return the switch push button 11 to the initial position, and a weak spring, a low-repulsive material, or the like can be provided between the switch push button 11 and the substrate 15. In the present preferred embodiment, a low-repulsive material 16 is preferably used.

In the present preferred embodiment, the two magnetoelectric transducers 21 and 31 include bases 22 and 32, respectively, and the bases 22 and 32 have magnetosensitive sections 23 and 33 and external electrodes (not shown in FIG. 1), respectively. The two magnetoelectric transducers 21 and 31 are mounted using flip-chip bonding so that the surfaces on which the magnetosensitive sections 23 and 33 are defined face the substrate 15. The magnetoelectric transducers 21 and 31 are mounted using the external electrodes through an electroconductive adhesive 17.

The structure of the two magnetoelectric transducers 21 and 31 will be described in more detail.

FIG. 2 shows two semiconductor magnetoresistive elements preferably used as the two magnetoelectric transducers 21 and 31 according to the present preferred embodiment of the present invention.

The two magnetoelectric transducers 21 and 31 share one base made of silicone into which the bases 22 and 32 are unified.

On the base 22 of the first magnetoelectric transducer 21 of the two magnetoelectric transducers 21 and 31, a semiconductor magnetoresistive thin film 23a made of InSb (indium antimonide) is provided and has a meandering line pattern. The semiconductor magnetoresistive thin film 23a preferably is generally formed using vacuum deposition, for example. A plurality of multi-layered short-circuiting electrodes 23b made of Ni/Cr/Au, Cr/Ni/Au, or the like are defined on the semiconductor magnetoresistive thin film 23a. The short-circuiting electrodes 23b are formed into a multi-layer structure using a method such as vapor deposition or sputtering, for example. In FIG. 2, however, the multi-layer structure is not shown for simplification of illustration. The semiconductor magnetoresistive thin film 23a and the short-circuiting electrodes 23b function as the magnetosensitive section 23. The first magnetoelectric transducer 21 further includes an external electrode 24 to be connected to a circuit pattern on the substrate 15 or the second magnetoelectric transducer 31. The external electrode 24 is preferably formed of the same electrode material using the same method as the short-circuiting electrodes 23b.

On the base 32 of the second magnetoelectric transducer 31, a semiconductor magnetoresistive thin film 33a made of InSb (indium antimonide) is defined in a meandering line pattern. The semiconductor magnetoresistive thin film 33a is preferably formed in the same shape, of the same electrode material, and using the same method as the semiconductor magnetoresistive thin film 23a of the first magnetoelectric transducer 21. A plurality of multi-layered short-circuiting electrodes 33b are defined on the semiconductor magnetoresistive thin film 33a. The number of short-circuiting electrodes 33b is smaller than the number of short-circuiting electrodes 23b of the first magnetoelectric transducer 21. The semiconductor magnetoresistive thin film 33a and the short-circuiting electrodes 33b function as the magnetosensitive section 33. The second magnetoelectric transducer 31 further includes an external electrode 34 to be connected to the circuit pattern of the substrate 15 or the first magnetoelectric transducer 21.

The first and second magnetoelectric transducers 21 and 31 having the above-described structure have largely different magnetic resistance change characteristics. Specifically, the first magnetoelectric transducer 21 has a predetermined magnetic resistance change characteristic while substantially no magnetic resistance change occurs in the second magnetoelectric transducer 31. However, the first and second magnetoelectric transducers 21 and 31 exhibit substantially identical resistance changes due to the temperature change.

The circuit structure of the magnetic sensor 14 in the multistage switch 10 will now be described with reference to FIG. 3.

In the magnetic sensor 14, the two magnetoelectric transducers 21 and 31 are connected in series, and an input voltage Vin is applied. If the multistage switch 10 has two operating stages to be switched, first and second threshold values V1 and V2 are set in the magnetic sensor 14.

A voltage V at a node between the two magnetoelectric transducers 21 and 31 is compared, as a detected potential of the magnetic sensor 14, with the first threshold value V1 using a comparator C1, and is also compared with the second threshold value V2 using a comparator C2. An operation instruction is transmitted from the magnetic sensor 14 to the camera according to those comparison results.

Figure 4:
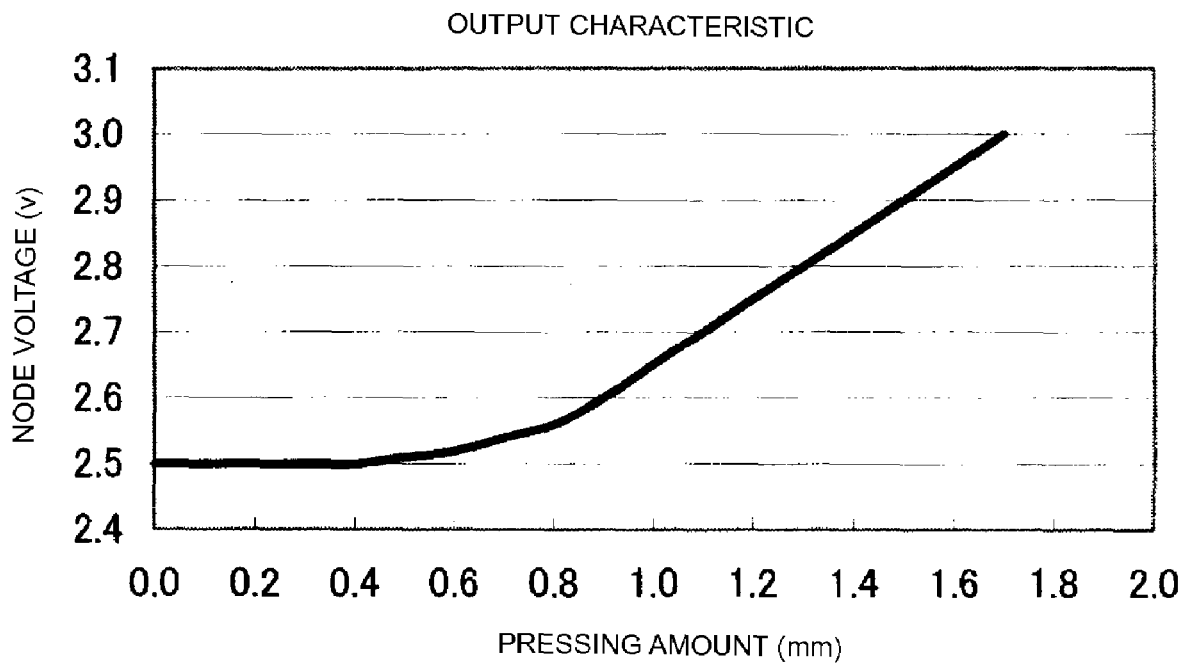
FIG. 4 is a graph showing the relationship between the distance from a magnetic member of a magnetic sensor preferably included in the multistage switch according to a preferred embodiment of the present invention and a detected potential.

If the multistage switch has n operating stages to be switched, as indicated by a two-dot chain line shown in FIG. 4, a circuit structure in which the voltage V is compared with the n-th threshold Vn using a comparator Cn may be used.

The operation of the multistage switch 10 having the above-described structure is as follows.

First, a user presses the switch push button 11 to perform photographing using the camera. The pressed switch push button 11 gradually approaches the magnetic sensor 14. Therefore, the magnet 13 in the switch push button approaches the first and second magnetoelectric transducers 21 and 31 in the magnetic sensor 14. Then, the resistance value of the first magnetoelectric transducer 21 changes. The resistance value of the second magnetoelectric transducer 31 does not substantially change. The change in resistance value due to the approaching of the magnet 13 causes a change in the voltage V at the node between the two magnetoelectric transducers 21 and 31, and the voltage V is compared with the first threshold value V1, the second threshold value V2, ..., and the n-th threshold value Vn. An operation instruction is transmitted from the magnetic sensor 14 to the camera according to those comparison results.

Although substantially no magnetic resistance change occurs in the second magnetoelectric transducer 31, the resistance change characteristic of the second magnetoelectric transducer 31 due to the temperature change is substantially identical to that of the first magnetoelectric transducer 21. Therefore, the potential V at the node between the two magnetoelectric transducers 21 and 31 depends on electrical characteristics of the first magnetoelectric transducer 21, i.e., the magnetic sensitivity. Since the temperature characteristics of the two magnetoelectric transducers 21 and 31 connected in series are substantially identical, no potential difference between the two magnetoelectric transducers 21 and 31 occurs due to the temperature change. Thus, the voltage V serving as a detected potential at the node between the two magnetoelectric transducers 21 and 31 is not affected by the temperature change. The voltage V serving as a detected potential of the magnetic sensor 14 of the present preferred embodiment is therefore a potential indicating a change that purely depends on the magnetic change, in which the influence of a change in ambient temperature is canceled, in the change in the potential of the first magnetoelectric transducer 21.

A specific operation example in which the number of stages in which the operation of the camera is switched is two, the first stage corresponding to the focusing operation of the camera and the second stage corresponding to the shutter release operation, will be described with reference to FIGS. 1 and 4.

As shown in FIG. 1, the distance between the magnet 13 and the two magnetoelectric transducers 21 and 31 is preferably set to about 2 mm when the switch push button 11 is not pressed. As shown in FIG. 4, the voltage V at the node between the magnetoelectric transducers 21 and 31 in this state is preferably set to about 2.6 V. It is assumed that the switch push button 11 can be pressed up to about 1.7 mm. As shown in FIG. 4, the relationship between the pressing amount of the switch push button and the voltage V at the node between the magnetoelectric transducers 21 and 31 is such that, although a large change does not occur in the voltage V when the pressing amount is 0 to about 0.5 mm, a significant change gradually occurs in the voltage V with respect to the pressing amount. When the pressing amount is about 0.8 mm or more, it can be found that the voltage V changes in a substantially one-dimensional linear manner.

This characteristic is obtained because semiconductor magnetoresistive elements are used as the magnetoelectric transducers 21 and 31. The amount of change in resistance value with respect to a small change in the distance from the magnet 13 is large, and the amount of change in the voltage value to be output is also large. Therefore, the output signal can be directly compared with the threshed values for determining the operation of the multistage switch 10. Further, the voltage V to be output permits a conversion efficiency of about 10% of the input voltage Vin applied to the two magnetoelectric transducers connected in series, and higher efficiency than various magnetoelectric transducers such as Hall elements and magnetoresistive elements formed of ferromagnetic metal thin films is attained, which is suitable for use in compact electronic apparatuses.

In the multistage switch 10, as can be seen from the output characteristic shown in FIG. 4, as threshold values in the two-stage operation switching, for example, the first threshold value V1 is preferably set to about 2.7 V+0.05 V and the second threshold value V2 is preferably set to be not less than about 2.9 V to ensure a difference of about 0.4 mm in the pressing amount of the switch push button 11 from the first threshold value V1 to the second threshold value V2. A voltage value serving as a threshold value may be set as a range, like the first threshold value V1, or may be set as a boundary, like the second threshold value V2, e.g., whether or not the voltage value exceeds about 2.9 V. In the present preferred embodiment, the first threshold value V1 is used for focusing and is given a certain range. If the voltage exceeds the range and is near the second threshold value V2, the focusing operation is canceled. Therefore, the user can understand that the pressing amount of the switch push button 11 has advanced too much. Since the operation corresponding to the second threshold value V2 is the shutter release operation, the second threshold value V2 is not given a specific range and is set so that the operation is performed if the voltage V exceeds the second threshold value V2. Even if the first threshold value V1 is used for the focusing operation, the first threshold value V1 may not be given a range and may be set to, for example, about 2.7 V so that the focusing operation can be performed if the voltage V exceeds the threshold value of about 2.7 V.

In the multistage switch 10 according to a preferred embodiment of the present invention, therefore, since the voltage V serving as a detected potential linearly changes, it is easy to set a threshed value for the multistage switch. Further, the number of stages can be increased only with a simple circuit design. Therefore, multiple stages greater than two stages can easily be set, which is substantially impossible in a multistage sensor using disc springs according to the related art.

In the present preferred embodiment, a semiconductor magnetoresistive element is preferably used as a magnetoelectric transducer. Instead of a semiconductor magnetoresistive element, a Hall element or a ferromagnetic magnetoresistive element can be used because similar advantages are achieved without generating strong reaction force when the switch push button is pressed. However, the conversion efficiency of a Hall element or a ferromagnetic magnetoresistive element with respect to an input voltage is lower than that of a semiconductor magnetoresistive element. Therefore, preferably, a semiconductor magnetoresistive element is used as a magnetoelectric transducer in a multistage switch of a compact electronic apparatus.

Further, in the present preferred embodiment, a switch push button and a magnet are separately provided, by way of example. However, a switch push button defined by combining a magnetic member having magnetic properties with a switch push button into a single unit, e.g., a switch push button made of plastic magnet, may be used.

Further, in the present preferred embodiment, a semiconductor magnetoresistive element is preferably used as a magnetoelectric transducer and is mounted on a substrate using flip-chip bonding, by way of example. A magnetosensitive section may be mounted using wire bonding so as to face a magnetic member.

Further, in the present preferred embodiment, two magnetoelectric transducers are preferably used, of which the second magnetoelectric transducer has a lower magnetic sensitivity and is used as a magnetoelectric transducer for temperature compensation. For example, the second magnetoelectric transducer may be mounted on a corner of a substrate and disposed at a position that is not affected by magnetic force. Thereby, the second magnetoelectric transducer can be the same as the first magnetoelectric transducer, and can also be used for temperature compensation. However, in this case, since the size of the substrate is large, the structure of the present preferred embodiment of the present invention in which the magnetic sensitivity of the second magnetoelectric transducer is reduced and the first and second magnetoelectric transducers are disposed adjacent to each other is suitable for use in compact electronic apparatuses.

While in the present preferred embodiment, the operation mechanism of the switch push button has been described in the context of a weak spring or a low-repulsive material, the operation mechanism is not limited thereto. Not only a physical operation mechanism but also an operation mechanism that is controlled by an electrical signal can be used as long as the operation mechanism of the switch push button is independent from an operation signal system of the magnetic sensor, that is, as long as an operation mechanism is not related to an operation signal of the magnetic sensor.

Figure 5:
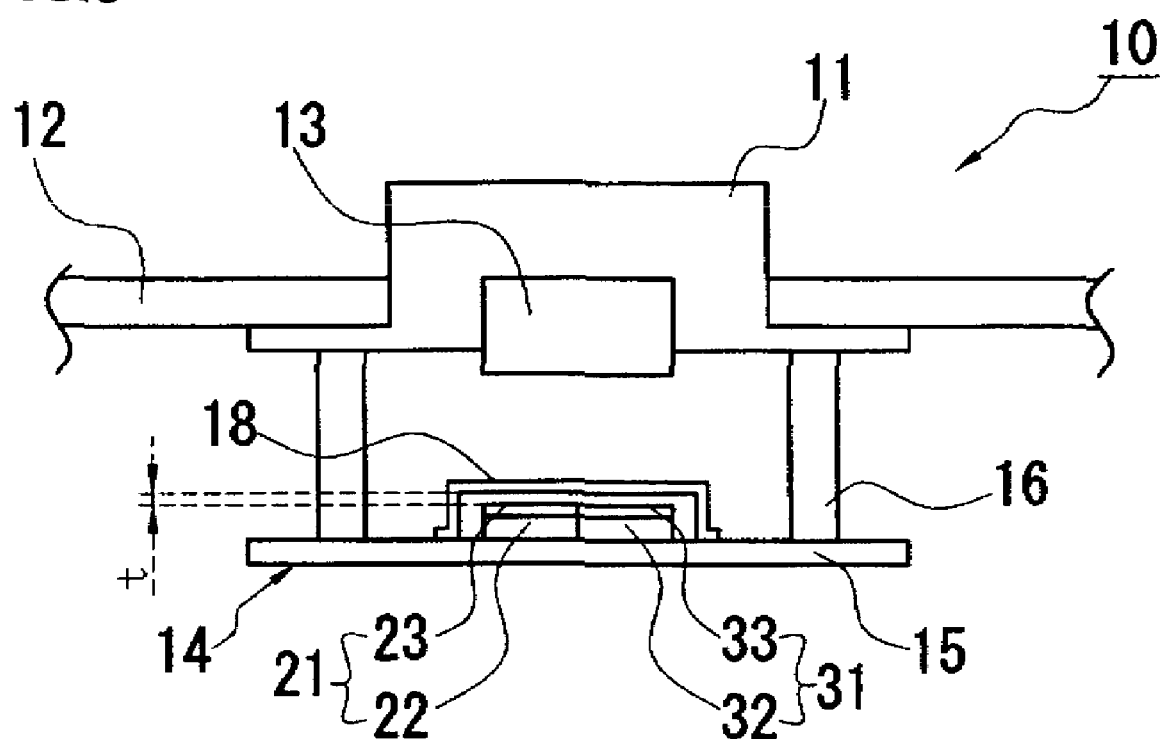
FIG. 5 is a schematic diagram showing a structure of a multistage switch according to another preferred embodiment of the present invention.

In the present preferred embodiment, the magnetic sensor is preferably not provided with a package. For example, as shown in FIG. 5, the magnetic sensor 14 may be configured such that the magnetoelectric transducers 21 and 31 are covered by a package 18. In FIG. 5, the magnetoelectric transducers 21 and 31 are mounted preferably using wire bonding so that the magnetosensitive sections 23 and 33 face the magnetic member and the bases 22 and 32 are mounted on the substrate 15. In FIG. 5, wires are not shown. In general, wires formed of gold or aluminum wires having a line diameter of about 50 μm are preferably used, and ball bonding or wedge bonding is preferably performed, for example. In packaging, a resin with flexibility is coated to a thickness of about 0.1 mm on the surface of the magnetoelectric transducers so that no stress is applied to loop (slack) portions or bonding portions of the wires. Then, the magnetoelectric transducers are packaged with a high-fluidity resin. The thickness of the resin used for packaging is reduced as much as possible to increase the actual range of the output characteristic. However, if the thickness is too thin, the physical strength of the elements is reduced. Therefore, preferably, the package thickness is about 0.15 mm to about 0.20 mm. The package design is done so that a space t between the package 18 and the magnetosensitive sections 23 and 33 of the magnetoelectric transducers 21 and 31 preferably is not more than about 0.3 mm, thereby reducing the thickness of the magnetic sensor to ensure a large operation region including the switch push button 11.

As described above, a multistage switch according to various preferred embodiments of the present invention allows a user to smoothly press a switch push button without being subjected to strong physical reaction force such as force of disc springs. Therefore, particularly when the multistage switch is used in a camera or the like, the focusing operation corresponding to the operating state of the first stage can be performed with a very low possibility of occurrence of camera-shake, etc.

Further, even if the moving distance of the switch push button is small, an output characteristic having a large output value with respect to a small change in magnetic force caused by the change in the distance can be obtained. Furthermore, the output characteristic exhibits an improved linearity, and it is easy to set threshed values for multiple stages. Therefore, the multistage switch used in a camera can be used not only as a multistage switch used for two operations of focusing and releasing a shutter but also as a multistage switch to be operated in a larger number of stages. For example, a stage for preparing the camera for the shutter release operation can be provided between the focusing stage and the actual shutter release stage, or a stage for performing photographing substantially at the same time as the actual shutter release operation, etc., can be provided. Consequently, no time error is produced between the timing of releasing a shutter in a digital camera and the timing of actually photographing a subject.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multistage switch comprising:
    a magnetic sensor including:
        a substrate; and
        a first magnetoelectric transducer defined on the substrate;
    a switch push button; and
    a magnetic member provided in the switch push button and disposed so as to face the first magnetoelectric transducer; wherein
    the magnetic sensor is arranged to detect, as a detected potential, a potential produced at the first magnetoelectric transducer in the magnetic sensor by a change in a distance between the magnetic sensor and the magnetic member; and
    at least two threshold values are provided for the detected potential of the first magnetoelectric transducer, and an operating state is changed according to results of comparison between the threshold values and the detected potential.

2. The multistage switch according to claim 1, wherein the first magnetoelectric transducer comprises a semiconductor magnetoresistive element.

3. The multistage switch according to claim 1, wherein the magnetic sensor includes the first magnetoelectric transducer and a second magnetic transducer connected in series, the detected potential is a detected potential at a node between the first and second magnetoelectric transducers, and the first magnetoelectric transducer has a predetermined change in a potential produced by a change in a distance between the first magnetoelectric transducer and the magnetic member, and the second magnetoelectric transducer has substantially no change in a potential produced by a change in a distance between the second magnetoelectric transducer and the magnetic member, and the first magnetoelectric transducer and the second magnetoelectric transducer have substantially identical temperature characteristics.

4. The multistage switch according to claim 3, wherein the first magnetoelectric transducer comprises a semiconductor magnetoresistive element, including a semiconductor magnetoresistive thin film defined on a base, a plurality of short-circuiting electrodes defined on the semiconductor magnetoresistive thin film, and an external electrode connected to the outside, and the second magnetoelectric transducer comprises a semiconductor magnetoresistive element, including a semiconductor magnetoresistive thin film defined on the base, and an external electrode connected to the outside, and including, on the semiconductor magnetoresistive thin film, no short-circuiting electrodes or a smaller number of short-circuiting electrodes than the number of short-circuiting electrodes included in the first magnetoelectric transducer.

5. The multistage switch according to claim 1, wherein a moving mechanism of the switch push button is independent from an operation signal system in the magnetic sensor.

6. The multistage switch according to claim 1, wherein the magnetic sensor includes a package covering the first magnetoelectric transducer, and the package is disposed on the magnetic sensor so that a space between the package and a magnetosensitive section of the first magnetoelectric transducer is not more than about 0.3 mm.

* * * * *